United States Patent
Schweitzer, III et al.

(10) Patent No.: US 11,467,197 B2
(45) Date of Patent: Oct. 11, 2022

(54) ELECTRIC POWER SYSTEM VOLTAGE MONITORING AND CONTROL WITH ENERGY PACKETS

(71) Applicant: Schweitzer Engineering Laboratories, Inc., Pullman, WA (US)

(72) Inventors: Edmund O. Schweitzer, III, Pullman, WA (US); Gregary C. Zweigle, Pullman, WA (US); Ellery A. Blood, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 34 days.

(21) Appl. No.: 17/308,138

(22) Filed: May 5, 2021

(65) Prior Publication Data
US 2021/0278447 A1    Sep. 9, 2021

Related U.S. Application Data

(63) Continuation of application No. 16/811,129, filed on Mar. 6, 2020, now Pat. No. 11,035,891.

(51) Int. Cl.
| G01R 21/06 | (2006.01) |
| G06Q 50/06 | (2012.01) |
| G01R 21/133 | (2006.01) |

(52) U.S. Cl.
CPC .......... *G01R 21/06* (2013.01); *G01R 21/133* (2013.01); *G06Q 50/06* (2013.01)

(58) Field of Classification Search
CPC .. G01R 21/06; G01R 21/133; G01R 19/2513; G06Q 50/06
See application file for complete search history.

(56) References Cited

U.S. PATENT DOCUMENTS

| 2002/0173927 A1* | 11/2002 | Vandiver | G01R 31/3272 |
| | | | 702/122 |
| 2009/0204268 A1* | 8/2009 | Eaves | H02H 3/30 |
| | | | 700/295 |
| 2009/0296583 A1* | 12/2009 | Dolezilek | H04L 43/026 |
| | | | 370/241 |

* cited by examiner

*Primary Examiner* — Dominic E Hawkins
(74) *Attorney, Agent, or Firm* — Richard M. Edge

(57) ABSTRACT

Electric power system voltage control and voltage stability may be calculated using energy packets. Sets of negative energy packet sets normalized by a set of positive and negative energy packet sets may be used for voltage control by adding or removing capacitive units. Energy packet voltage indicators may be calculated using energy packets, and used to determine voltage stability. Control actions may be taken depending on the determined voltage stability.

16 Claims, 12 Drawing Sheets

ELECTRIC POWER SYSTEM VOLTAGE MONITORING AND CONTROL WITH ENERGY PACKETS

RELATED APPLICATION

This application claims priority as a continuation application to U.S. patent application Ser. No. 16/811,129 filed on 6 Mar. 2020 titled "Electric Power System Voltage Monitoring and Control with Energy Packets" naming Edmund O. Schweitzer III, Gregary C. Zweigle, and Ellery A. Blood as inventors, which is incorporated herein by reference in its entirety.

TECHNICAL FIELD

This disclosure relates to calculating energy passing through a point of an electric power system using energy packets. This disclosure further relates to calculating a value of energy passing through a point of an electric power delivery system using energy packets.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
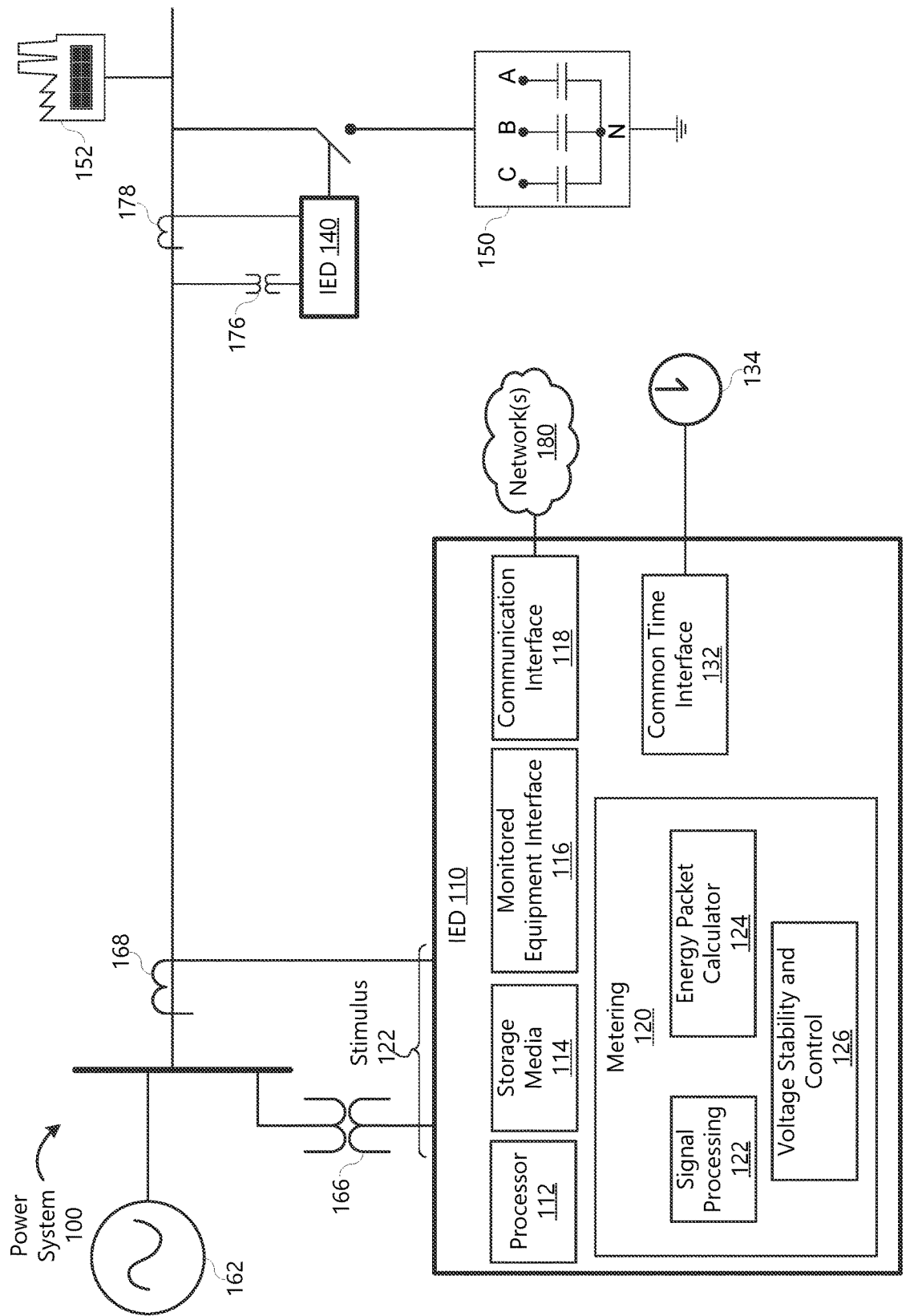
FIG. 1 illustrates a one-line diagram of an electric power delivery system including intelligent electronic devices (IEDs) for monitoring portions of the electric power delivery system.

Electric power delivery systems have been designed for the safe and reliable generation, transmission, and distribution of electric power to consuming loads. Electric power markets transact electricity, which is the medium that transfers energy from generators to consumers (via the electric power delivery system). Voltage control is important for maintaining power system stability, minimizing losses, and keeping voltage magnitudes within required ranges. In prior systems, voltage control algorithms use complex power as an input and act to control reactive power in combination with other targets. Complex power is a well-defined concept for the single-frequency sinusoidal steady-state operation of linear electric circuits. However, with the addition of renewables and power-electronically coupled devices, the dynamics of electric power systems are changing. Under these conditions, both time-averaged real power and methods to calculate reactive power have limitations. For example, non-sinusoidal waveforms introduce error into these prior methods. This disclosure defines the concept of an energy packet. Energy packets may be computed and communicated at a fixed rate, with a common time reference. Energy packets may precisely measure energy exchanges, independent of system frequency and phase angles. The application of energy packet measurements is used in embodiments herein to improve power system monitoring and control using voltage control and voltage stability assessment.

Described herein are systems and methods that use energy packets to measure energy through select points on the electric power delivery system for voltage control and stability assessment. For the purposes of this document, such a point could be thought of as an infinitely small slice of a conductor at which voltage at, and current though, that slice can be measured. In some embodiments, a point may be considered to be a location at which a piece of power apparatus (e.g., machine, line, transformer) connects to a bus. The point does not store, produce, nor consume energy. The point may include, but does not require, the presence of current (CT) or voltage (PT) measurement apparatus (e.g. current transducers (CTs) potential transducers (PTs) or the like). If measurement apparatus are collocated with a point, it may be alternatively referred to as a measurement point or point of metering. For practical application, CTs and PTs cannot typically be collocated at a point. As such, the measurement point is typically the location of the CT and the voltage is considered collocated as long as minimal impedance exists between the location of the PT and CT. The disclosures herein divide the energy at each point of measurement according to a direction of energy transfer at the point. Energy packets may be used for voltage control and assessment.

The embodiments of this disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks or computer instructions. Software modules or components may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment.

FIG. 1 illustrates a simplified one-line diagram of an electric power delivery system (generation, transmission, distribution, and consumption) 100 that includes intelligent electronic devices (IEDs) 110, 140 configured to meter electricity through respective points of the electric power delivery system. The electric power delivery system 100 comprises various equipment such as generation 162 (a power source such as an electric power generator, transmission system, or the like), buses, transmission and distribution lines, transformers, circuit breakers, distribution lines, and the like for generating, transmitting, and delivering energy to a load such as consumer 152. IEDs 110, 140 may obtain power system signals from portions of the electric power delivery system either directly (as illustrated) or indirectly from various devices such as remote terminal units (RTUs) or merging units. Electric power system signals may be obtained using instrument transformers such as current transformers (CTs) 168, 178, potential transformers (PTs) 166, 176, and the like. IEDs 110, 140 may use power system signals such as signals representing current and voltage to determine energy transferred through equipment of the electric power delivery system.

IEDs 110 and 140 may be any device configured to meter electric power. IED 110 may include a stimulus input 122 configured to receive CT and PT secondaries and condition the signals received therefrom for use by the IED 110. Signal conditioning may include various filters, step-down transformers, analog-to-digital converters (ND) and the like to produce digitized analog signals. In various embodiments, digitized analog signals may be provided by other devices such as merging units. IED 110 may include a processor 112 for executing instructions. The processor 112 may be implemented as a field-programmable gate array (FPGA), microprocessor, application specific integrated circuit, or the like. Storage media 114 may be a repository for computer instructions executed by the processor 112, settings, samples, and the like. Storage media 114 may include a single or multiple physical storage media, one or more of which may be packaged with the processor 112. A monitored equipment interface 116 may be in communication with monitored equipment of the electric power delivery system such as a circuit breaker for sending signals to the equipment and receiving status signals from the equipment. A communication interface 118 may facilitate communications with various other devices either directly or, as illustrated, via a network 180.

As discussed briefly above, electric power systems may be monitored and controlled to increase efficiency using voltage stability and control. To calculate the flow of energy, IED 110 may also include metering 120, which may be embodied as computer instructions on storage media 114 for execution by processor. Metering 120 may include further signal processing 122 to condition obtained currents and voltages. The IED 110 may include an energy packet calculator 124 to calculate energy packets as discussed below. The IED 110 may further include voltage stability and control 126 that may use energy packets to provide voltage stability and control. In various embodiments, calculation and/or communication of energy packets uses a common time signal that may be obtained by the IED using a common time interface 132 in communication with a common time source 134. Common time signal may be any time signal that from a time source 134 that is common to the devices on the electric power delivery system. Common time source 134 may include a global navigation satellite system (GNSS), WWVB, or other similar common time. Common time signal may be delivered via radio or over other communication media using a common protocol such as RIG. In various embodiments, the common time signal may be received via the communication interface 132. The common time signal may be a common network time.

Although details of only IED 110 are illustrated, IED 140 may include the same or similar elements to perform power system voltage stability and control. IEDs 110 and 140 may be in communication using direct communication, the network 180, or the like.

Figure 2:
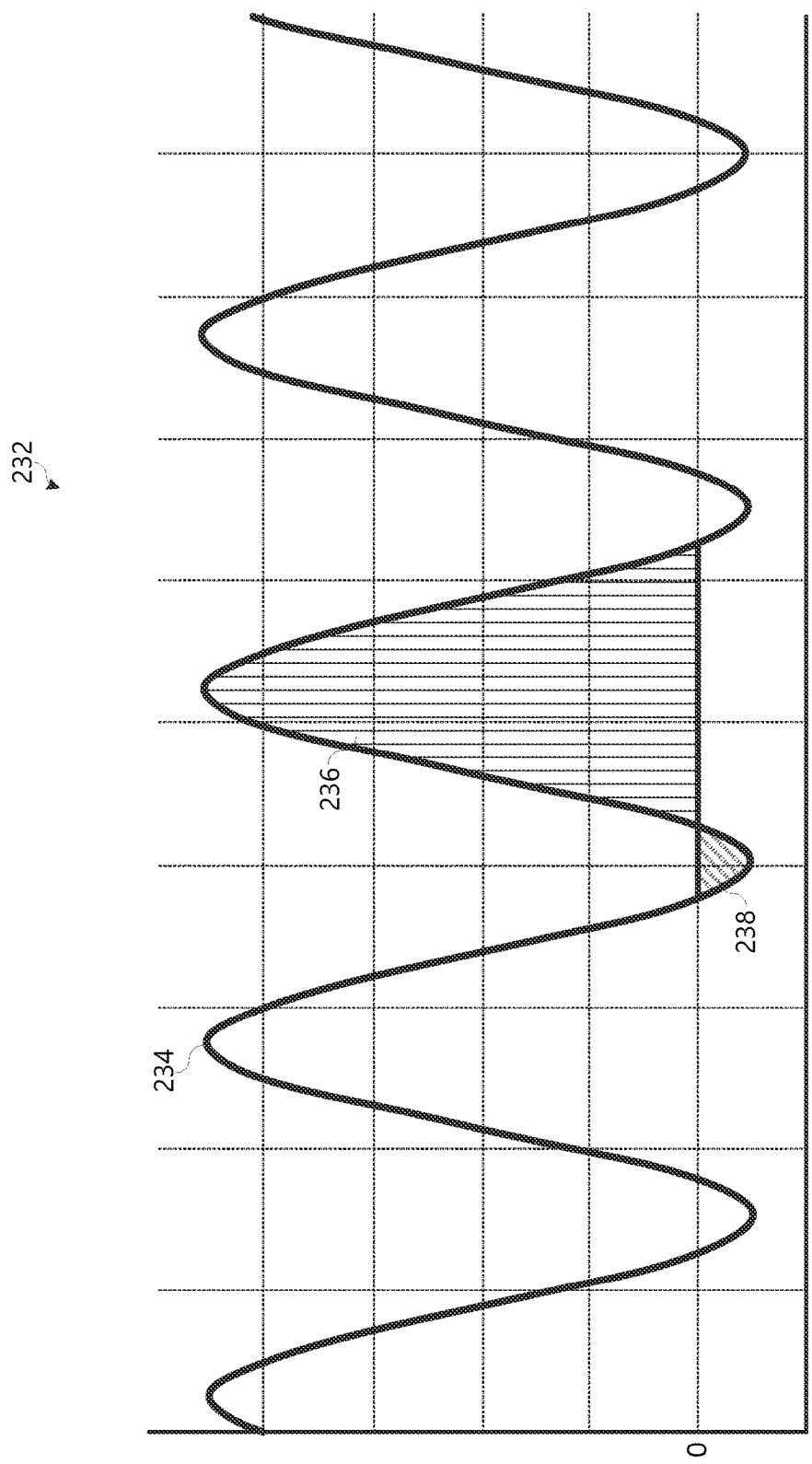
FIG. 2 illustrates a plot of electric power over time.

FIG. 2 illustrates an example plot 232 of electric power 234 over time. The sign (positive or negative) of an energy packet as it moves through a measuring point may be assigned by convention, and calculated by the measuring device using a setting corresponding with the convention. In the illustrated embodiments, when an energy packet is positive, it represents a measurement of energy moving through the place where energy is being measured and away from a piece of equipment; and when an energy packet is negative, it represents a measurement of energy moving through the place where energy is being measured and toward a piece of equipment. During region 238 the sign the of power flow is negative, meaning that power is flowing in the opposite direction to the CTs configured polarity. For a CT that is configured to measure a positive value for energy leaving a specific device, this then indicates that at the measuring point energy is entering during the measured time interval. During region 36 the power is positive. This indicates that at the measuring point energy is leaving during the measured time interval. Energy packet signs may be determined for consistency among devices on the system. For example, the sign of an energy packet may be positive when energy moves away from a location in the electric power system, and negative when energy moves toward a location. Positive valued transmission of energy includes both that which ultimately drives a load as well as energy returned to the system from temporary storage in a passive reactive element. Negative transmission of energy (therefore, the reception of energy) includes both energy applied to a load as well as that which temporarily stores in a passive reactive element.

As described below, the disclosures hereof are fundamentally different than a time-averaged power $P_{avg}$ and a reactive power Q combination. In the time-averaged methods, $P_{avg}$ is defined as the power resulting from the component of current in phase with the voltage and Q is the power resulting from the component of current out of phase with the voltage. By this definition, the mathematics attempts to separate power driving loads and power circulating in a lossless manner among passive reactive power devices. However, physical interpretation of reactive power is challenging in all cases except the pure steady-state sinusoidal case. Energy packets provide a simpler approach. The disclosures herein provide a method that divides the energy passing through each point into portions related to the direction of energy transfer at the point. This simplifies accounting for energy exchanges in today's electric power system characterized by fast dynamics, non-sinusoidal signals, and power-electronically coupled devices.

Equation 1 defines the continuous-time energy packet ε(t) from voltages v(σ) and currents i(σ) over each time interval $T_{EP}$:

$$\varepsilon(t) = \int_{t-T_{EP}}^{t} v(\sigma)i(\sigma)d\sigma \quad \text{Eq. 1}$$

The fixed interval $T_{EP}$ does not need to depend on any estimated power system quantity such as fundamental frequency. In this way, an energy packet may be considered a time-domain concept. Energy packets can be calculated independently for each phase of a poly-phase system or as a consolidated value. Equation 2 defines a consolidated three-phase energy packet $\varepsilon_3(t)$. A basic three-phase continuous-time energy packet may be defined using Equation 2, where the integration interval is over the same time interval for all three phases:

$$\varepsilon_3(t) = \int_{t-T_{EP}}^{t} [v_a(\sigma)i_a(\sigma) + v_b(\sigma)i_b(\sigma) + v_c(\sigma)i_c(\sigma)]d\sigma \quad \text{Eq. 2}$$

Equation 3 defines the discrete-time energy packet ε[n] that may be useful for digital signal processing implementations where the value $T_s$ is the data sample period, and M represents the number of sampled analog values per energy packet:

$$\varepsilon[n] = T_s \sum_{m=M(n-1)+1}^{Mn} v[m]i[m] \quad \text{Eq. 3}$$

It should be noted that energy packet computations may down sample the original signal by a factor of M. Equation 3 shows this by Mn in the summation ranges. The notation for a discrete-time quantity is with hard brackets: $v[m] \equiv v(mT_s)$.

Figure 3:
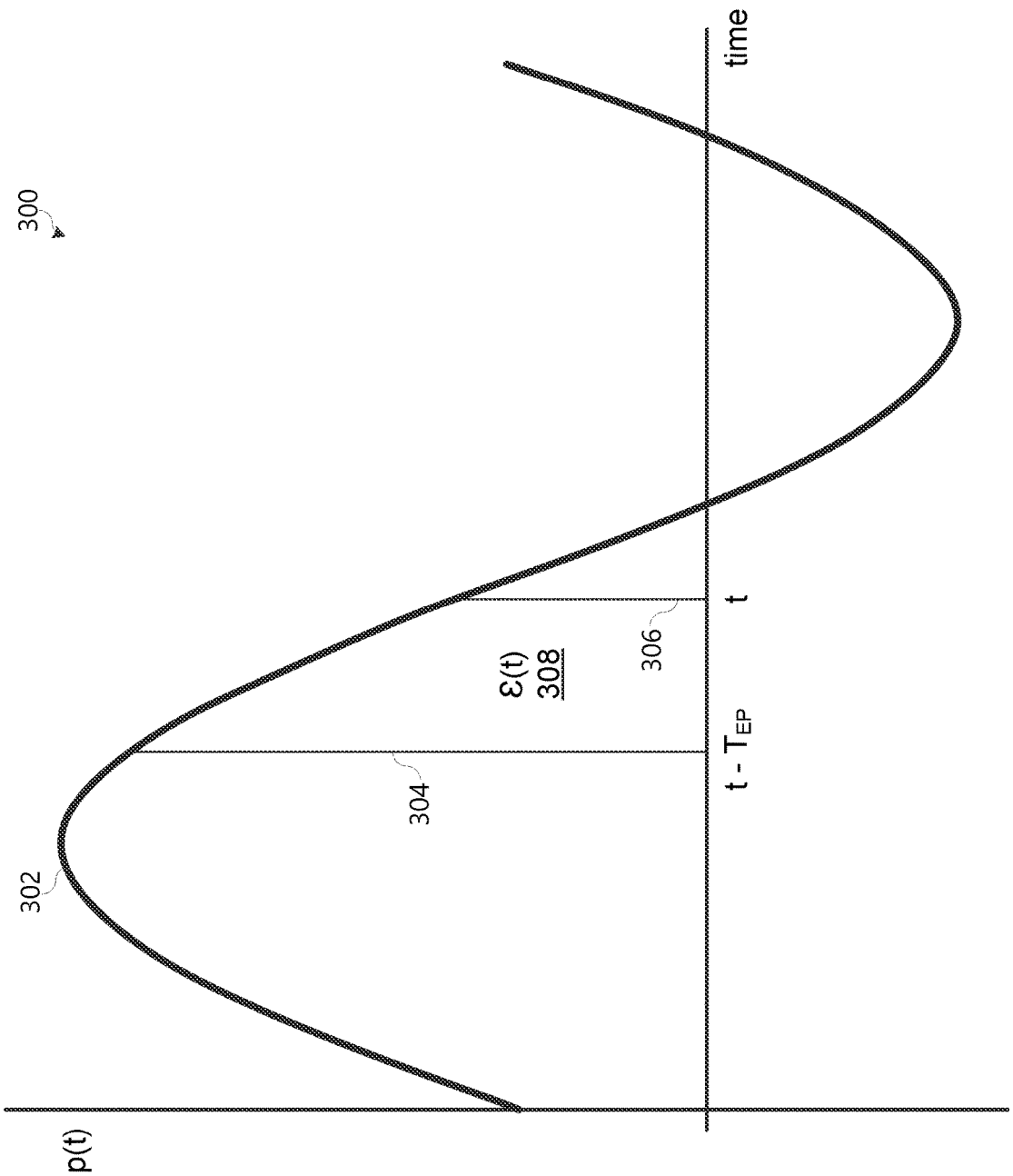
FIG. 3 illustrates a plot of a product of voltage and current over time including an energy packet interval.

FIG. 3 illustrates a plot 300 of an instantaneous product of voltage and current 302 over time. An energy packet 308 is bounded at times 304 and 306. The energy packet 308 is calculated for the continuous-time case. The integration interval (Equation 1) covers from the present time t and then back $T_{EP}$ seconds to the previous time $t-T_{EP}$.

Figure 4:
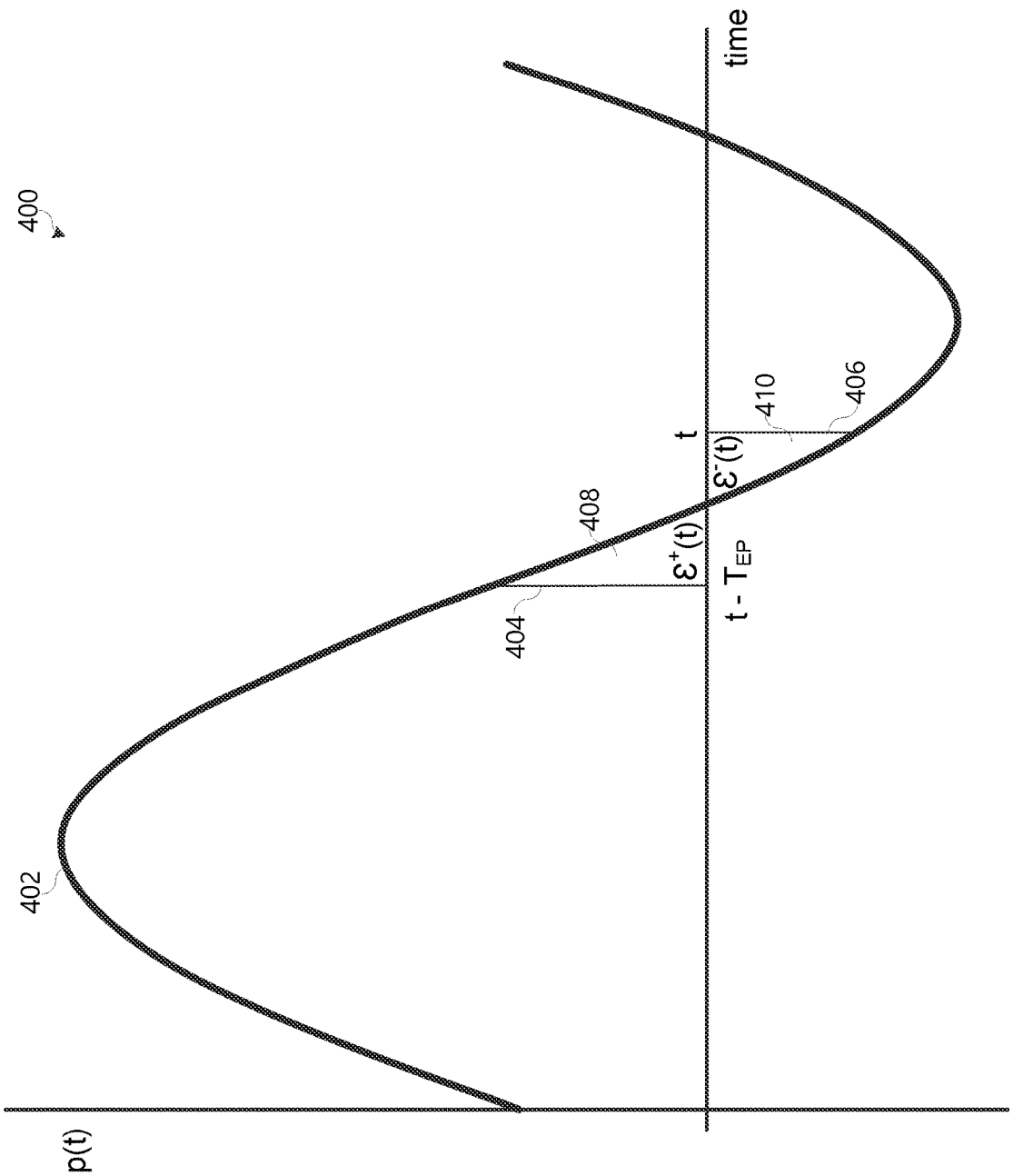
FIG. 4 illustrates another plot of a product of voltage and current over time including an energy packet interval.

Positive and negative direction energy transfer may be calculated over each integration interval. FIG. 4 illustrates a plot 400 of an instantaneous product of voltage and current 402 over time, where the integration interval from 404 (at time $t-T_{EP}$) to 406 (at time t) includes power in both directions. In this case two separate values are computed, one for energy flowing in the positive direction $\varepsilon^+$ and one for energy flowing in the opposite, or, negative, direction, $\varepsilon^-$ during this period. The total energy packet is as defined in Eq. 1. The algorithm dividing a total energy packet into positive and negative regions easily extends to an arbitrary number of zero crossings over the integration interval. In various embodiments, the total of all power flowing in the positive direction may be combined for energy packet $\varepsilon^+$ and the total of all power flowing in the negative direction may be combined for energy packet $\varepsilon^-$. Both packets may be reported for the same time instant t and for the same interval $t-T_{EP}$.

The separation into positive and negative regions is given mathematically as follows in Equations 4 and 5, for the discrete-time case:

$$\varepsilon^+[n] = T_s \sum_{m=M(n-1)+1}^{Mn} \begin{cases} v[m]i[m] & \text{if: } v[m]i[m] > 0 \\ 0 & \text{otherwise} \end{cases} \quad \text{Eq. 4}$$

$$\varepsilon^-[n] = T_s \sum_{m=M(n-1)+1}^{Mn} \begin{cases} v[m]i[m] & \text{if: } v[m]i[m] < 0 \\ 0 & \text{otherwise} \end{cases} \quad \text{Eq. 5}$$

For illustration, it is convenient to show continuous-time waveforms as in FIGS. 3 and 4. However, the energy packets are typically implemented (calculated and used) with the discrete-time approach as shown in Equations 4 and 5. Energy packets for multiple phases, such as three phases, may be calculated as independent summations of Equation 4 over all three phases for the respective values of $\varepsilon^+$ and summations of Equation 5 over all three phases for $\varepsilon^-$.

Figure 5:
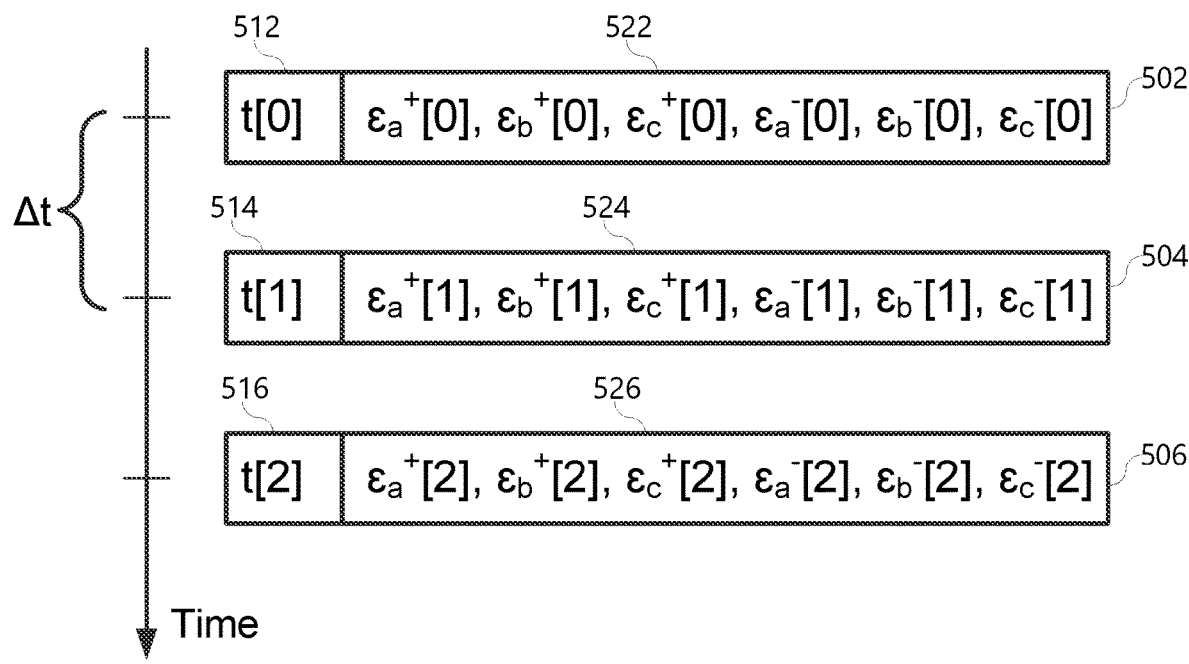
FIG. 5 illustrates a timeline of energy packet communication over time intervals.

FIG. 5 illustrates an example of streaming energy packets 502, 504, 506, with the index n arbitrarily initialized at zero. Each energy packet 502, 504, 506 may include a timestamp, t[n] 512, 514, 516 associated with the energy packet data 522, 524, 526. Each energy packet 502, 504, 506 may be a three-phase energy packet associated with the timestamp. Energy may be divided into positive and negative groups. Energy packets may be communicated at an average rate of one packet every $MT_s$ seconds. The actual transmit interval, Δt, may vary around that average value due to processing and communication latencies. Energy packets may also include auxiliary information such as source, source location, and measurement location names. In various embodiments, the present time t (or $nT_s$) may be synchronized across all measuring devices using a time signal that is common among the measuring devices such as a global time signal (GNSS) or the like. Each energy packet across the power system may correspond to a common synchronous time value.

Energy packets may be used for voltage applications such as local voltage control and wide-area voltage stability assessment. Voltage control and stability using energy packets instead of the traditional methods are an improvement in that the power system frequency is not needed. Further, energy packets are a better representation of power transfer during non-sinusoidal operating conditions than the previous power calculations. Voltage control may be performed using a summation of negative energy packets. The negative energy packet set, $E^-$, for a continuous-time case may be defined using Equations 6A-6D:

$$v(t) = V\sin(\omega t) \quad \text{Eq. 6A}$$

$$i(t) = I\sin(\omega t - \phi) \quad \text{Eq. 6B}$$

$$p(t) = v(t)i(t) \quad \text{Eq. 6C}$$

$$E^- = \int_0^{\frac{\phi}{\omega}} p(\sigma)d\sigma \quad \text{Eq. 6D}$$

where frequency is ω and the phase angle by which current lags voltage is ϕ. Computing the integral an applying trigonometric reductions achieves Equation 7 for the negative energy packet set:

$$E^- = \frac{VI}{2}\frac{1}{\omega}[\phi\cos(\phi) - \sin(\phi)] \quad \text{Eq. 7}$$

Similarly, the positive energy packet set is given in Equation 8:

$$E^+ = -\frac{VI}{2}\frac{1}{\omega}[(\pi - \phi)\cos(\phi) + \sin(\phi)] \quad \text{Eq. 8}$$

The positive and negative energy packet sets may be normalized by $E_{net}$ as illustrated in Equations 9 and 10:

$$\hat{E}^- = \frac{E^-}{E_{net}} = \frac{\phi - \tan(\phi)}{\pi} \qquad \text{Eq. 9}$$

$$\hat{E}^+ = \frac{E^+}{E_{net}} = \frac{\pi - \phi + \tan(\phi)}{\pi} \qquad \text{Eq. 10}$$

where $E_{net}$ is a sum of $E^+$ and $E^-$. A relationship between energy packets and traditional real and reactive power from sinusoidal steady-state conditions may be expressed in Equations 11 and 12:

$$E_{net} = \frac{\pi}{\omega} P_{avg} \qquad \text{Eq. 11}$$

$$\begin{bmatrix} E^- \\ E^+ \end{bmatrix} = \frac{1}{\omega} \begin{bmatrix} \phi & -1 \\ \pi - \phi & 1 \end{bmatrix} \begin{bmatrix} P \\ Q \end{bmatrix} \qquad \text{Eq. 12}$$

As outlined above and illustrated in Equations 4-10, energy packets, energy packet sets (positive and negative), and normalized energy packet sets (positive and negative) may be calculated independently of power system frequency.

Traditional calculations of complex power for electric power system monitoring and protection have disadvantages, especially as the power system frequency changes. The real power component of complex power is computed according to Equation 13, where $T_{sys}$ is the period corresponding to the fundamental frequency:

$$P_{avg}(t) = \frac{1}{T_{sys}} \int_{t-T_{sys}}^{t} v(\sigma)i(\sigma)d\sigma \qquad \text{Eq. 13}$$

For steady-state sinusoidal systems, an advantage of Equation 11 is that it integrates perfectly over exactly one period. However, in actual systems, the frequency continuously changes, which is particularly true during disturbances. Accordingly, presented herein are improvements that use energy packets as described above, which are calculated independent of power system frequency. Thus, power system frequency deviations from nominal do not affect the energy or power calculations.

Figure 6:
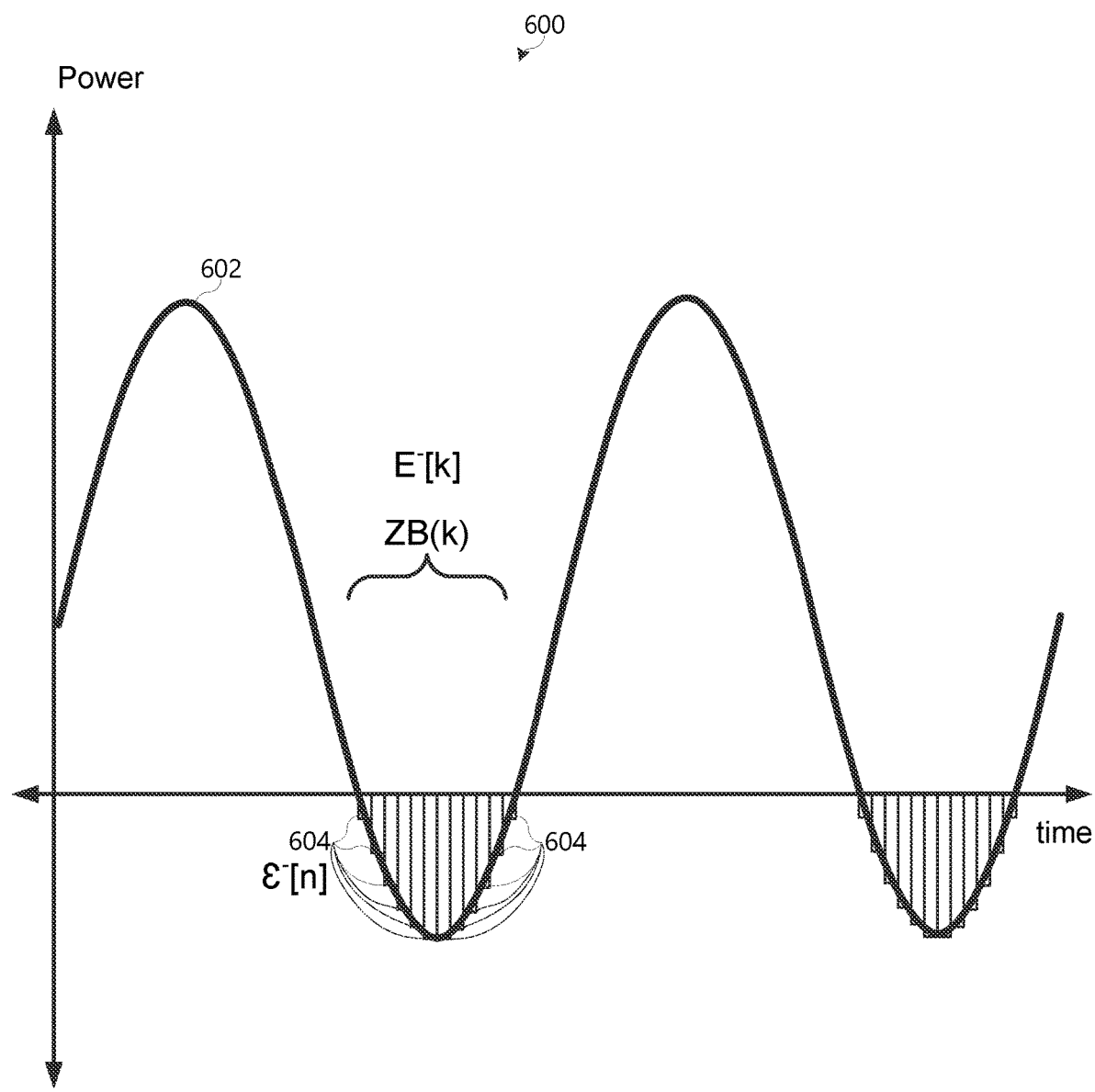
FIG. 6 illustrates a plot showing a division of energy packet groups into bins for computing negative energy packet sets.

For nonstationary, multifrequency, or distorted conditions, the energy packet definition is unchanged and does not depend on frequency estimates or assumptions. The voltage assessment and control applications of energy packets described herein use sets of energy packets, as defined above. The computation of these sets is by summation of the individual energy packets over a specified period, either of fixed duration or as defined by zero-crossing boundaries (ZB). FIG. 6 illustrates a plot 600 of an instantaneous product of voltage and current 402 over time, with detail of individual negative energy packets 604. Mathematically, the computation is given in Equation 14. $E^-$ is computed numerically by summing the negative energy packets, $\varepsilon^-[n]$ 604. The result is the energy packet set $E^-[k]$ for region k.

$$E^-(k) = \Sigma_{n \in ZB(k)} \varepsilon^-[n] \qquad \text{Eq. 14}$$

It should be noted that $E^+$ may be similarly computed numerically by summing the positive energy packets, $\varepsilon^+[n]$ over a positive region bounded by zero-crossings. $E_{net}$ may be computed by summing the positive and negative energy packet sets over a desired period. In various embodiments, $E_{net}$ may be determined by calculating the sum of positive and negative energy packets over a desired period. Similarly, the positive and/or negative energy packet sets may be determined by summing the respective positive and/or negative energy packets over a period. Other methods of calculating the positive and/or negative energy packet sets and $E_{net}$ are contemplated and may be used.

Energy packet sets and normalized energy packet sets may be used as described in the embodiments below for local voltage control and for voltage stability assessment.

The field of voltage control spans from capacitor bank controllers to wide-area voltage stabilizing and optimal control systems. This section describes the application of energy packets to local voltage control via a switched capacitor, such as the capacitor bank 150 illustrated in FIG. 1. This simple example does not require shared streaming energy packets, and the control actuation may be slow (on the order of minutes).

Figure 7:
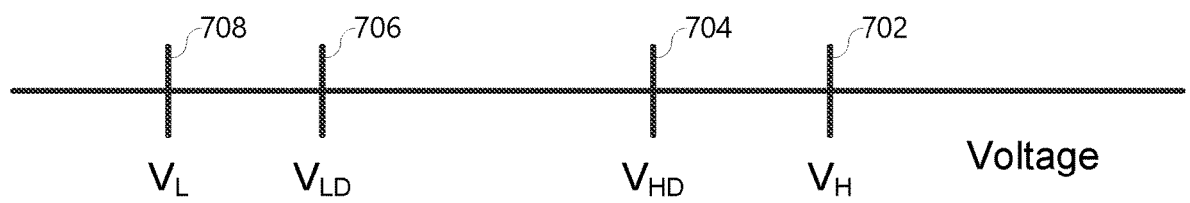
FIG. 7 illustrates a plot of capacitor bank control voltage levels.

With reference to FIG. 7, when the measured voltage exceeds a high threshold $V_H$ 702, the controller begins a timer to trip a segment of the capacitor banks. Similarly, when the measured voltage is below a low threshold $V_L$ 708, the controller begins a timer to insert a segment of the capacitor banks. In the deadband voltage zones, between $V_L$ 708 and low deadband threshold $V_{LD}$ 706 or between $V_H$ 702 and high deadband threshold $V_{HD}$ 704, the voltage controller inhibits its operation. While voltage is in the zone between $V_{LD}$ 706 and $V_{HD}$ 704, the controller operates to maintain power factor or reactive power flow.

The energy packet controller, in the operating zone between $V_{LD}$ 706 and $V_{HD}$ 704, keeps $\hat{E}^-$ within limits $\hat{E}_0^{min}$ and $\hat{E}_0^{max}$. These limits can be calculated in multiple ways. In one embodiment, the limits are converted from the limits of an existing power factor control using Eq. 9. In another embodiment, the limits could be set to the values of $\hat{E}^-$ present when the voltage of an uncompensated line is pulled down to a value of 0.9 p.u. by a real-power load (0.95 p.u. for the upper limit). The limits for the operating region shown in FIG. 8 were computed using this second method. For this application, it is acceptable to average the sets before applying the control algorithm. To minimize equipment wear from frequent operations, pickup timers set to $E_{time}^{min}$ and $E_{time}^{max}$, respectively, are employed. The limits and times for the pickup timers may be settings. These settings may be determined based on the power system and other factor. The settings may be entered upon commissioning the IED. Table 1 shows the control algorithm when the load is predominantly inductive:

TABLE 1

| Capacitor Control Pseudocode |
| --- |
| if $\hat{E}^-[n] < \hat{E}_0^{min}$ for t > $E_{time}^{min}$ <br> remove capacitor unit <br> else if $\hat{E}^-[n] > \hat{E}_0^{max}$ for t > $E_{time}^{max}$ <br> insert capacitor unit |

It should be noted that the control algorithm may be modified for systems with load that is predominantly capacitive. Determination of the inductive or capacitive nature of the network may be performed using a system identification technique described at the end of this disclosure.

The energy packet controller was simulated to demonstrate the voltage response to a range of real-power load impedance values. The current exhibits harmonic distortion.

Figure 8:
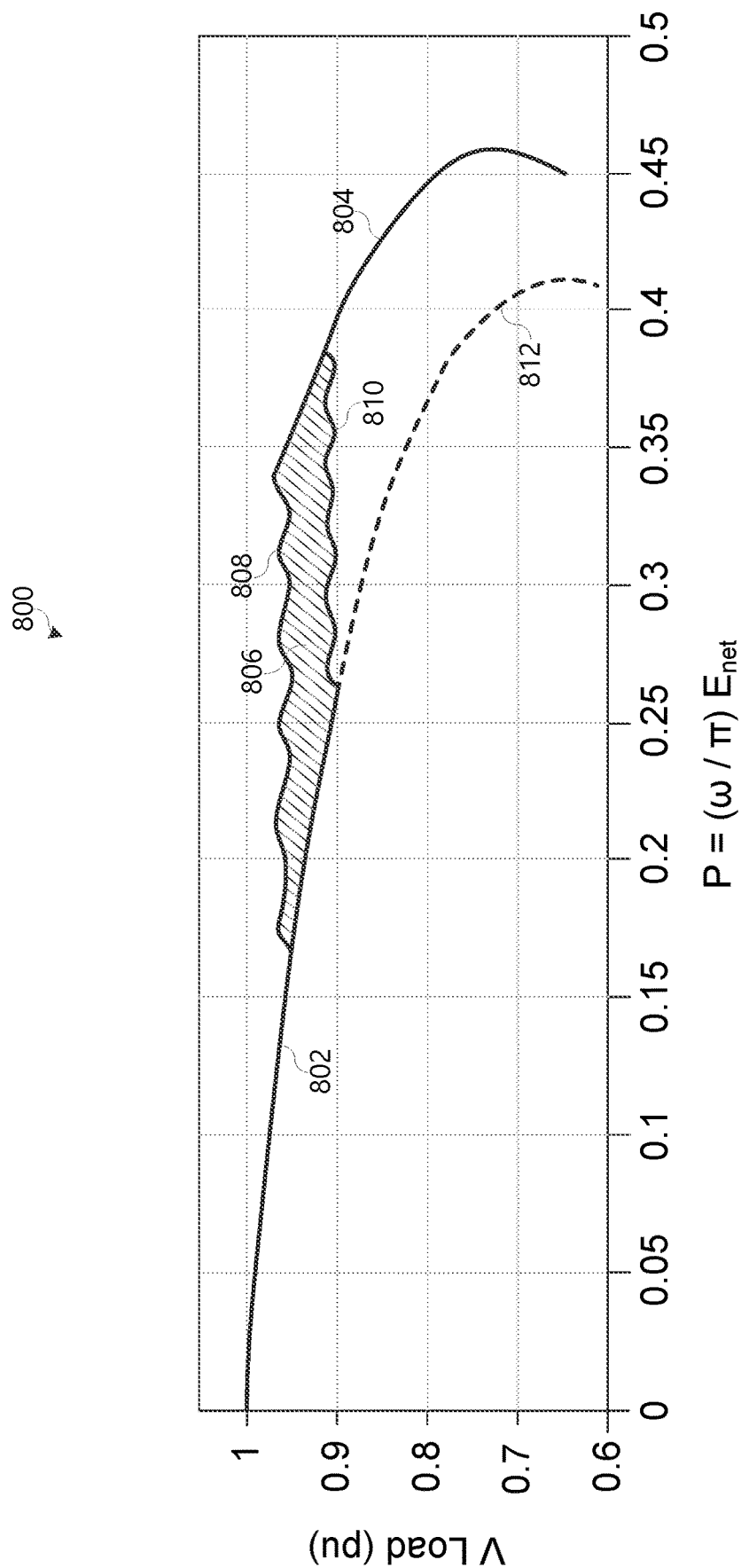
FIG. 8 illustrates a plot of energy packet control using capacitive compensation via discrete capacitor banks.

FIG. 8 shows a plot 800 of the response with capacitive compensation in nine discrete banks. The dashed curve 812 represents the system without compensation. The solid curves 802, 804 bounding the shaded region 806 represent the path as the load is monotonically increased (bottom curve 810), then monotonically decreased (top curve 808). The shaded region 806 bounded by these curves 808, 810 represents the operating band within which the energy packet voltage control algorithm maintains the proper system state. The insertion of each capacitor results in an immediate increase in voltage, with a corresponding constant-impedance power increase, leading to the sawtooth response. Voltage is measured at the load, and energy packets are measured at the line feeding the load.

The $\hat{E}^-$ thresholds may be calculated as follows: given a known complex line impedance, Z, the system is simulated with a driving voltage of 1 p.u. at one end of the line and a resistive load, with resistance R, at the other end. The magnitude of R is calculated such that the voltage at the load is reduced to 0.9 p.u. $\hat{E}^-$ is calculated at the source for the operating point where the calculated R is the load and the source voltage is a single-frequency sinusoid at nominal frequency. This value of $\hat{E}^-$ is $\hat{E}_0^{min}$. The process is repeated for a value of 0.95 p.u. at the load and the value of $\hat{E}^-$ used for $\hat{E}_0^{max}$.

Accordingly, an IED such as IED 140 of FIG. 1 may obtain power system measurements at a local portion of the power system, calculate energy packets and energy packet sets as described herein, and use the energy packet sets to control one or more capacitor units 150. The addition or removal of capacitor units may be performed for local voltage control.

There are many known techniques for assessing voltage stability. These include Thevenin impedance matching, generator reactive reserve monitoring, and decision trees. Additionally, techniques based on measured power system state are possible, including running full simulations to determine voltage trajectories in the presence of uncertainty and contingencies. The purpose of this section is to show a simpler design based on energy packets.

Here is a basic system to demonstrated the algorithm principle. Initially, sinusoidal steady-state conditions are assumed and the load varies with a single state variable, a. For example, control on state a may be attempting constant power or controlling impedance to increase load in response to demand. In Equation 15, the load power angle $\phi_L$ is a fixed constant:

$$\vec{Z}_L(\alpha) = \frac{1}{\alpha}(1 + j\tan\phi_L) \qquad \text{Eq. 15}$$

However, because increasing a is driving the load impedance to zero while the source voltage stays constant, the power delivered by the source can continuously increase.

Based on these principles, an assessment algorithm with energy packets is possible. The energy packets delivered at the source are monitored, and the assessment algorithm compares the energy packets consumed by the load for the same time stamps. At the maximum capability of the system, the value of energy packets delivered by the source continues to increase while the value of energy packets received by the load begins to decrease. Starting with Equation 14, the source-received energy packet set is defined as $E_s^-[k]$ and the load-received energy packet set as $E_L^-[k]$. Equation 16 defines the resulting energy packet voltage indicator (EVI):

$$EVI[k] = \frac{\Delta E_s^-[k]}{\Delta E_L^-[k]} \qquad \text{Eq. 16}$$

For a local voltage stability application, computing Equation 16 requires two devices measuring and sharing energy packets. Normally, energy at the source and load move in the same direction. At the system maximum, EVI[k] changes sign. For stability assessment, EVI[k] is compared to a suitable threshold (described later).

Figure 9:
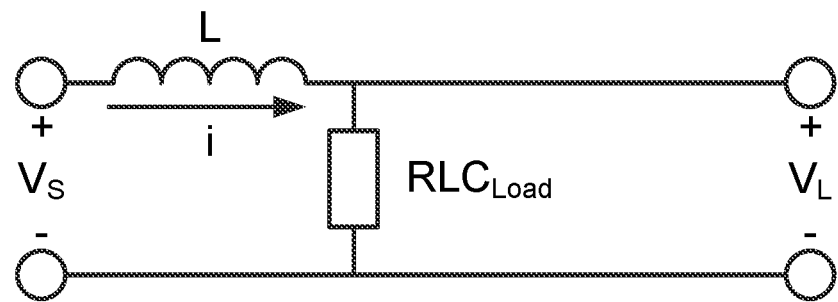
FIG. 9 illustrates a simplified one-line diagram representing a two-port network.
Figure 10A:
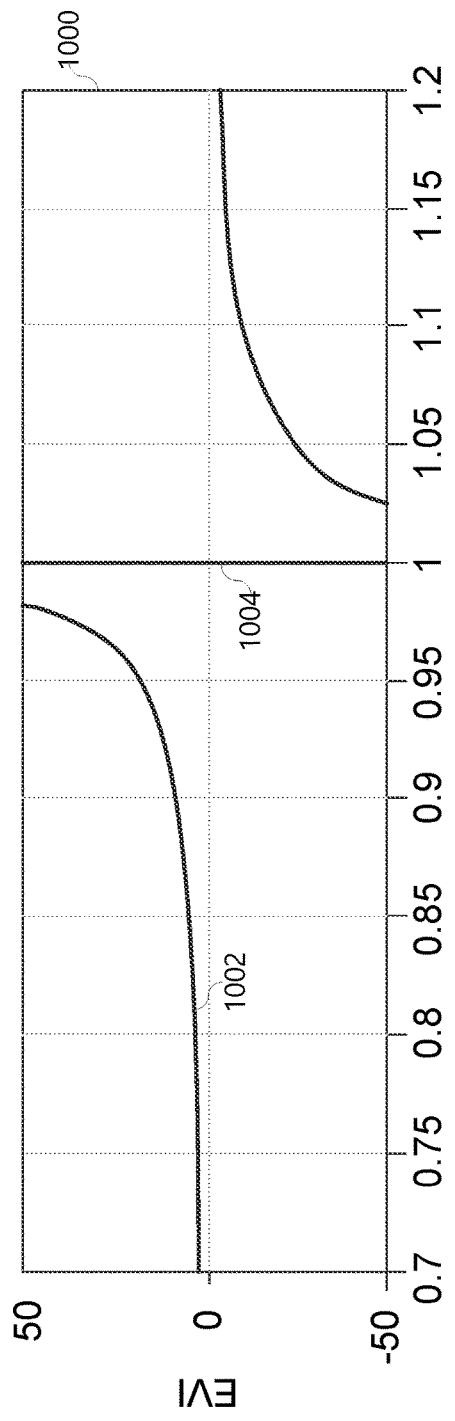
FIGS. 10A and 10B illustrate plots of inductive load for energy packet voltage index (10A) and voltage vs. power curve (10B).
Figure 10B:
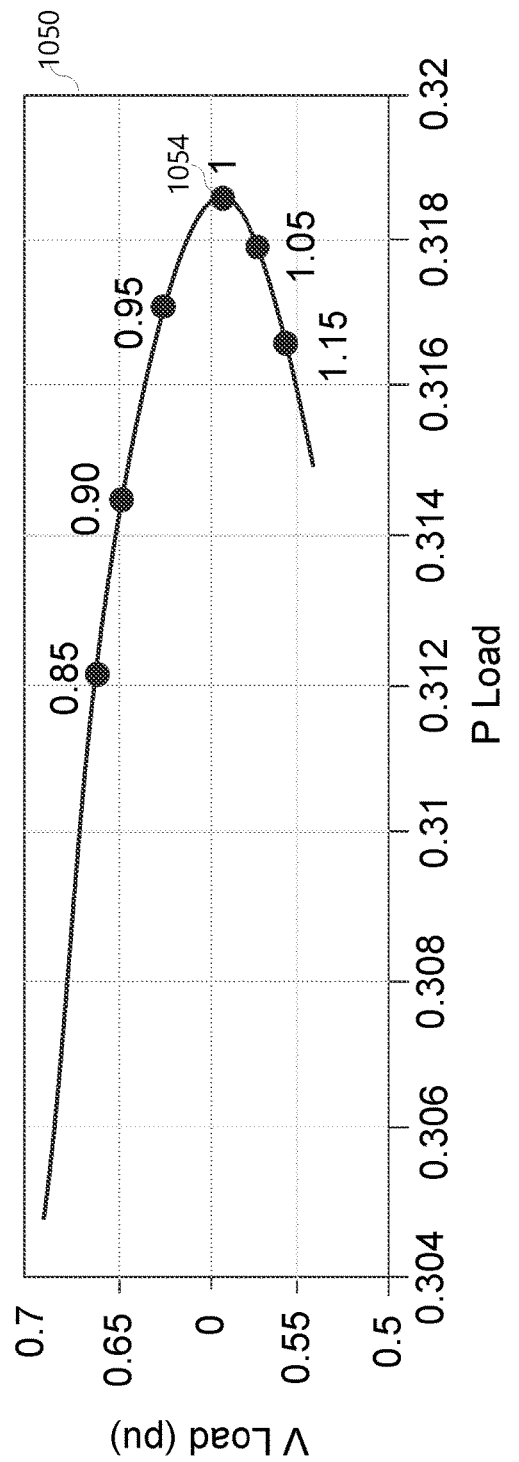

FIG. 9 illustrates a circuit diagram for a two-port network including a source voltage Vs, a load voltage $V_L$, and associated inductance L, current I, and load resistance-inductance-capacitance ($RLC_{Load}$) that may be used for analysis of the systems and methods described herein. FIGS. 10A and 10B illustrate plots 1000, 1050 of an example of EVI[k] compared to the voltage-versus-power curve for the circuit of FIG. 9 and load of Equation 15. For this example, the inductive load impedance angle ($\phi_L$) is 25 degrees. The transmission line impedance is j1, and the source voltage is 1 (per unit). As a increases (horizontal axis of FIG. 10A) the load power 1002 increases (horizontal axis of FIG. 10B) until the maximum load point is reached. For this example, maximum load 1004, 1054 is when $\alpha=1$ and $P_{Load} \approx 0.3185$ in per-unitized quantities. A large rate of change in EVI is a clear opportunity to establish a threshold for comparing against EVI to indicate an operating limit, well before reaching the maximum point.

Figure 11A:
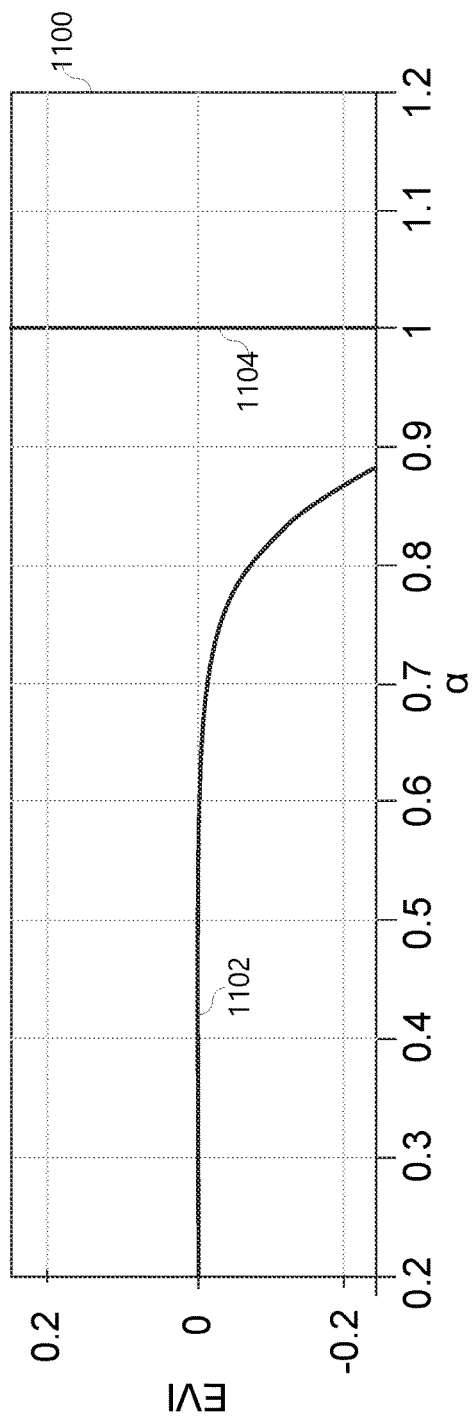
FIGS. 11A and 11B illustrate plots of compensated load for energy packet voltage index (11A) and voltage vs. power curve (11B).
Figure 11B:
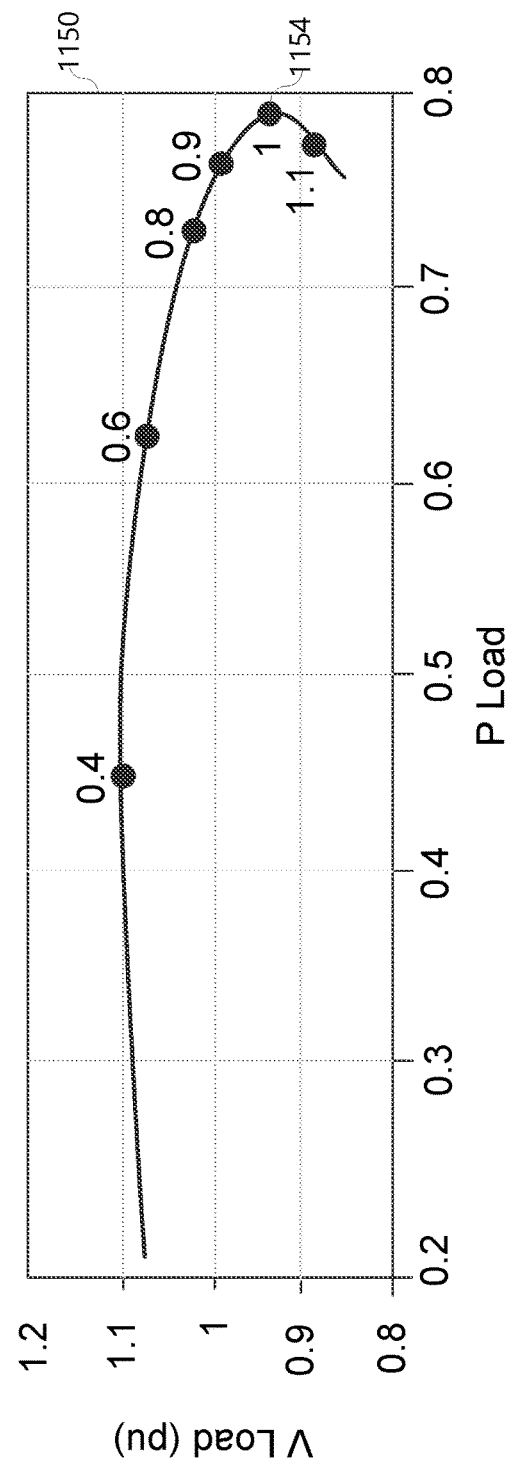

For the example of FIGS. 10A and 10B, the voltage itself would seem adequate for assessment. However, FIGS. 11A and 11B show the advantages of EVI in a more challenging case with a capacitive load impedance angle ($\phi_L$) of −25 degrees. Illustrated are plots 1100 and 1150 of EVI[k] compared to the voltage-versus-power curve of the circuit of FIG. 9 and load of Equation 15. For this example, there is a sharp decline in EVI[k] 1102 while the voltage stays at a high level, but it is well past the peak voltage 1104, 1154.

The application of Equation 16 over a wide area requires a slight modification. In this case, based on energy packet exchanges, the total energy delivered by generation and received by loads is computed on a time-synchronized basis at each control location, illustrated in Equation 17. The relative performance of $EVI_i[k]$ for location i indicates the area most suitable for voltage controls, either continuous or emergency. Since the indicator measures energy directly in a load-shedding scheme, it indicates the amount of load to shed. The numerator $\Delta E_s^-$ is based on the area of interest for voltage stability.

$$EVI_i[k] \equiv \frac{\Delta E_s^-[k]}{\Delta E_{L,i}^-[k]} \qquad \text{Eq. 17}$$

Figure 12B:
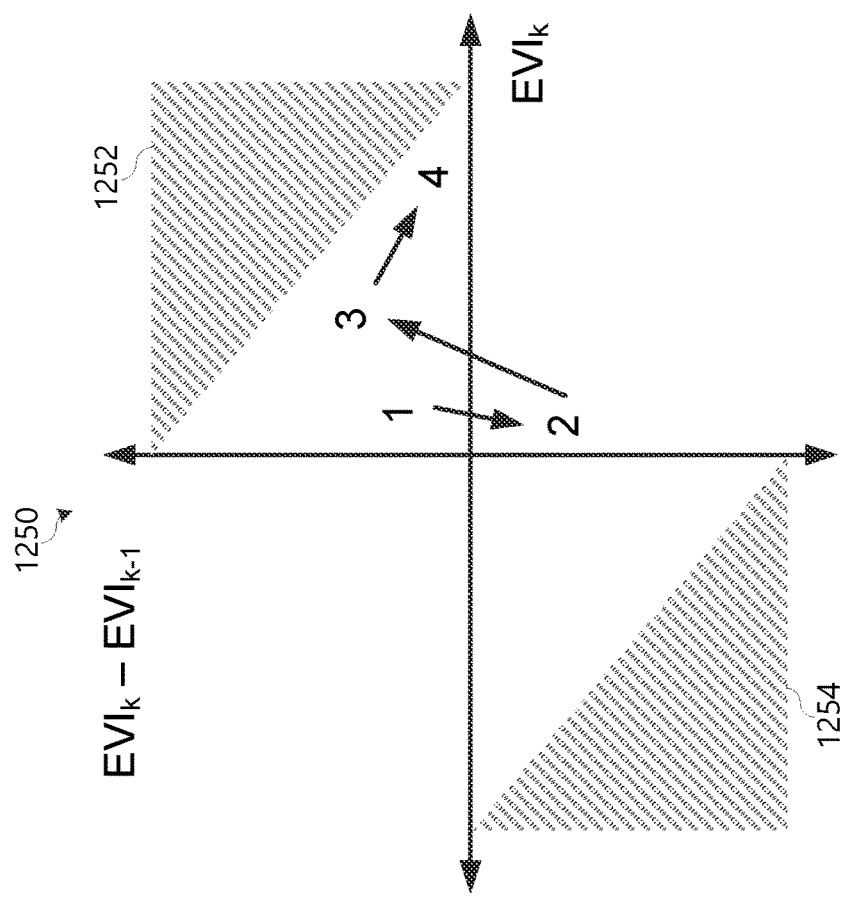
FIGS. 12A and 12B illustrate plots of voltage stability regions.
Figure 12A:
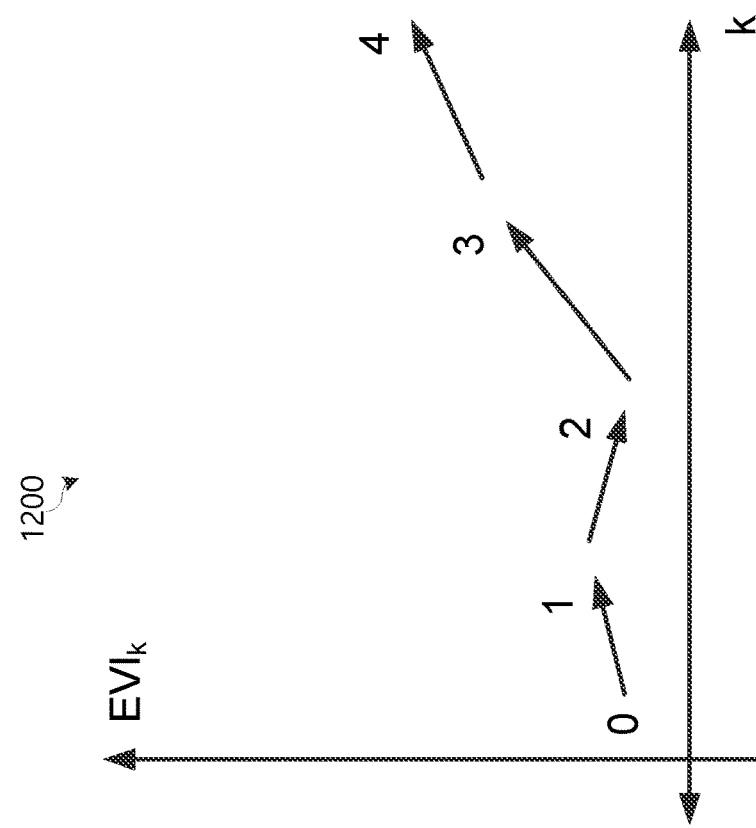

The detection of an impending voltage problem is achieved by taking advantage of the fact that proximity to the maximum power point is associated with voltage problems for typical load-control algorithms. Added security and sensitivity is achieved by including the EVI and its derivative, as shown plots 1200, 1205 of FIGS. 12A and 12B. The system voltage is declared stable when it is within the normal regions, and a stability problem is declared when it is within the shaded regions 1252, 1254. FIGS. 12A and 12B show a typical trajectory. In this example, EVI[k] moves through points 0, 1, 2, 3, and 4, as shown in FIG. 12A. Corresponding points in the voltage indicator plane are shown in FIG. 12B. If EVI[k] and its derivative exceed the thresholds and move into the shaded regions 1252, 1254, this signals a potential voltage instability. At this point, the systems and methods described herein may effect control algorithms.

Control algorithms may be developed for maintaining voltage stability, and may depend on the nature of the power system. Such algorithms may include disconnecting certain loads, connecting capacitor banks, disconnecting capacitor banks, adding power generation, removing power generation, controlling inverters to increase or decrease reactive power, and the like.

As mentioned above, the voltage control algorithm may depend on the nature of the electric power system loads as primarily inductive or capacitive. The following describes identification of the power system network as primarily inductive or primarily capacitive. Energy packets measure the energy sent and received at a given node over an interval of time. Energy packets are symmetric with the angle between current and voltage in steady state. Therefore, when an algorithm requires estimating the net capacitive or inductive nature of a network, a separate system identification algorithm is included. Although the system identification algorithm is not a contribution of this disclosure, this section demonstrates how to adapt two known algorithms for use with controllers based on energy packets. System identification may be performed by the metering module 120 of IED 110 in FIG. 1.

Because energy packets measure instantaneously in time, the identification algorithm must not be based on measuring frequency or angles. For example, measuring the angle between current and voltage is not an option. The strategy employed here is to apply an instantaneous power calculation and then consider the sign as an indication of an overall inductive or capacitive network. An instantaneous power expression is shown in Equation 18:

$$P_{react-0}(t) = \frac{1}{2\omega}\left(v\frac{di}{dt} - i\frac{dv}{dt}\right) \quad \text{Eq. 18}$$

Another option, without the derivatives, that requires polyphase signals is based on the instantaneous reactive power. First, the Clarke transformation is applied to three-phase voltages and currents, resulting in α, β, and γ components, shown in Equation 19:

$$P_{react-1}(t) = v_\alpha i_\beta - v_\beta i_\alpha \quad \text{Eq. 19}$$

For energy packet algorithms, the sign of Equations 10 or 19 indicates the inductive or capacitive nature of the network. With single-frequency sinusoidal conditions, both Eq. 18 and Eq. 19 calculate a constant value. When harmonics are present, the results of these may not be constant, but the averaged signal shows a strong prevalence to maintain the expected sign corresponding to capacitive and inductive loading. Thus, the parameter of interest (the sign) is used for identification, as shown in Equation 20:

$$\gamma = \text{sign}(p_{react}) \quad \text{Eq. 20}$$

With the determination of the nature of the power system as inductive or capacitive as shown in Equation 19, the embodiments herein may be tailored for the inductive or capacitive nature of the power system.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A device for electric power system voltage control, comprising:
   an interface for receiving electric power delivery system signals at a first point and a second point separate from the first point, providing current and voltage measurements from the first point and the second point;
   an energy packet calculator in communication with the stimulus interface to:
      calculate source energy packets over predetermined time interval lengths passing through the first point;
      calculate received energy packets over the predetermined time interval lengths passing through the second point;
      calculate a ratio of the source energy packets and received energy packets;
   and,
   a voltage controller in communication with the energy packet calculator to:
      compare the ratio and a derivative of the ratio with a threshold; and,
      when the ratio and the derivative of the ratio exceed the threshold, initiate a control action.

2. The device of claim 1, wherein the second location is selected as an area intended for voltage control.

3. The device of claim 1, wherein the energy packets are calculated by:
   calculating products of the current measurements and the voltage measurements obtained over a time interval of the predetermined time interval length;
   calculating a time interval power as a sum of the calculated products of the current and voltage measurements over the time interval; and,
   calculating an energy packet value for the time interval as a numerical integration of the product of instantaneous voltage and current measurements over that time interval.

4. The device of claim 3, wherein the energy packet calculator is configured to calculate the energy packet value as:

$$\varepsilon[n] = T_s \Sigma_{m=M(n-1)+1}^{Mn} + v[m]i[m]$$

where:
   ε[n] represents the energy packet value for sample n;
   $T_s$ represents the data sample period;
   M represents a factor for downsampling;
   v[m] represents a voltage value at sample m; and,
   i[m] represents a current value at sample m.

5. The device of claim 1, wherein the energy packet calculator is configured to calculate the ratio as:

$$EVI_i[k] \equiv \frac{\Delta E_s^-[k]}{\Delta E_L^-[k]}$$

where:
   $\Delta E_s^-[k]$ represents a set of the source energy packets;
   $\Delta E_L^-[k]$ represents a set of the received energy packets.

6. The device of claim 1, wherein the control action comprises one selected from the group consisting of: disconnecting a load; connecting a capacitor bank; disconnecting a capacitor bank; adding a source of generation; removing power generation; controlling an inverter to increase reactive power; controlling an inverter to decrease reactive power; and combinations thereof.

7. A system for electric power system voltage stability, comprising:
stimulus interfaces for receiving electric power delivery system signals at a local point and a remote point, providing current and voltage measurements;
an energy packet calculator in communication with the stimulus interfaces to calculate energy packets over predetermined time interval lengths passing through the local and remote points by:
calculating products of the current measurements and the voltage measurements obtained over a time interval of the predetermined time interval length;
calculating a time interval power as a sum of the calculated products of the current and voltage measurements over the time interval;
calculating source energy packet values for the time interval as a numerical integration of the product of instantaneous voltage and current measurements at the local point over that time interval;
calculating received energy packet values for the time interval as a numerical integration of the product of instantaneous voltage and current measurements at the remote point over that time interval; and,
calculating a ratio of the source energy packets and the received energy packets and,
a voltage stability controller in communication with the energy packet calculator to:
compare the ratio of the source energy packets and a derivative of the ratio of the source energy packets to a threshold; and,
when the ratio and the derivative of the ratio exceed the threshold, initiate a control action.

8. The system of claim 7, wherein the energy packet calculator is configured to calculate the energy packet values as:

$$\varepsilon[n]=T_s\Sigma_{m=M(n-1)+1}^{Mn}v[m]i[m]$$

where:
$\varepsilon[n]$ represents the energy packet value for sample n;
$T_s$ represents the data sample period;
M represents a factor for downsampling;
v[m] represents a voltage value at sample m; and,
i[m] represents a current value at sample m.

9. The system of claim 7, wherein the energy packet calculator is configured to calculate the ratio as:

$$EVI_i[k] \equiv \frac{\Delta E_s^-[k]}{\Delta E_L^-[k]}$$

where:
$\Delta E_s^-[k]$ represents a set of the source energy packets;
$\Delta E_L^-[k]$ represents a set of the received energy packets.

10. The system of claim 7, wherein the control action comprises one selected from the group consisting of: disconnecting a load; connecting a capacitor bank; adding a source of generation; removing a source of generation; controlling an inverter to increase reactive power; controlling an inverter to decrease reactive power; and combinations thereof.

11. A method for electric power system voltage control, comprising:
obtaining electric power delivery system signals at a first point and a second point separate from the first point;
calculating current and voltage measurements from the signals;
calculating source energy packets over predetermined time interval lengths passing through the first point and calculating received energy packets over the predetermined time interval length passing through the second point by:
calculating products of the current measurements and the voltage measurements obtained over a time interval of the predetermined time interval length;
calculating a time interval power as a sum of the calculated products of the current and voltage measurements over the time interval;
calculating an energy packet value for the time interval as a numerical integration of the product of instantaneous voltage and current measurements over that time interval; and,
calculating a ratio of the source energy packets and the received energy packets; and
controlling a voltage of the electric power system by:
comparing the ratio and a derivative of the ratio with a threshold; and
when the ratio and the derivative of the ratio exceed the threshold, initiating a control action.

12. The method of claim 11, wherein the second location is selected as an area intended for voltage control.

13. The method of claim 11, wherein the energy packets are calculated by:
calculating products of the current measurements and the voltage measurements obtained over a time interval of the predetermined time interval length;
calculating a time interval power as a sum of the calculated products of the current and voltage measurements over the time interval; and,
calculating an energy packet value for the time interval as a numerical integration of the product of instantaneous voltage and current measurements over that time interval.

14. The method of claim 13, wherein the energy packet values are calculated as:

$$\varepsilon[n]=T_s\Sigma_{m=M(n-1)+1}^{Mn}v[m]i[m]$$

where:
$\varepsilon[n]$ represents the energy packet value for sample n;
$T_s$ represents the data sample period;
M represents a factor for downsampling;
v[m] represents a voltage value at sample m; and,
i[m] represents a current value at sample m.

15. The method of claim 11, wherein the ratio is calculated as:

$$EVI_i[k] \equiv \frac{\Delta E_s^-[k]}{\Delta E_L^-[k]}$$

where:
$\Delta E_s^-[k]$ represents a set of the source energy packets;
$\Delta E_L^-[k]$ represents a set of the received energy packets.

16. The method of claim 11, wherein the control action comprises one selected from the group consisting of: disconnecting a load; connecting a capacitor bank; disconnecting a capacitor bank; adding a source of generation; removing a source of generation; controlling an inverter to increase reactive power; controlling an inverter to decrease reactive power; and combinations thereof.

* * * * *